United States Patent [19]

Rovin

[11] Patent Number: 5,049,728
[45] Date of Patent: Sep. 17, 1991

[54] IC CARD SYSTEM WITH REMOVABLE IC MODULES

[76] Inventor: George H. Rovin, Ojai Valley School, 723 El Paseo Rd., Ojai, Calif. 93023

[21] Appl. No.: 503,994

[22] Filed: Apr. 4, 1990

[51] Int. Cl.$^5$ ............................................. G06K 19/00
[52] U.S. Cl. .................................... 235/492; 235/487; 361/397
[58] Field of Search ................ 235/487, 492; 361/397, 361/401; 357/74

[56] References Cited

U.S. PATENT DOCUMENTS

| | | | |
|---|---|---|---|
| 4,822,988 | 4/1989 | Gloton | 235/492 |
| 4,825,283 | 4/1989 | Shino | 235/492 X |
| 4,835,846 | 6/1989 | Juan | 235/492 |

Primary Examiner—Harold Pitts
Attorney, Agent, or Firm—LaValle D. Ptak

[57] ABSTRACT

An IC card is disclosed having expanded on line utilization. The card includes a standard fixed microprocessor embedded in the plastic with exposed terminals for electrical interconnection with a standard card reader. The card, however, is modified by providing parallel data and control line bus conductors on an intermediate laminate in the card in electrical contact with the fixed microprocessor embedded in the card. A plurality of open receptacles then are provided in the surface of the card and extend to the bus conductors, exposing the bus conductors in the bottom of the receptacles. Removable information processing units embedded in tokens or modules may be placed into and removed from the receptacles and include contacts on the bottoms thereof for making electrical interconnections with the bus conductors. A slideable cover is used to hold the removable units in place after they have been inserted into the receptacles. The bus conductors electrically interconnect the removable units with the fixed standard microprocessor for access by the reader, thereby providing multiple on line use capability of the IC card. Customization and change of the systems with which the card may be used is effected by the choice of the removable units placed in the receptacles.

19 Claims, 2 Drawing Sheets

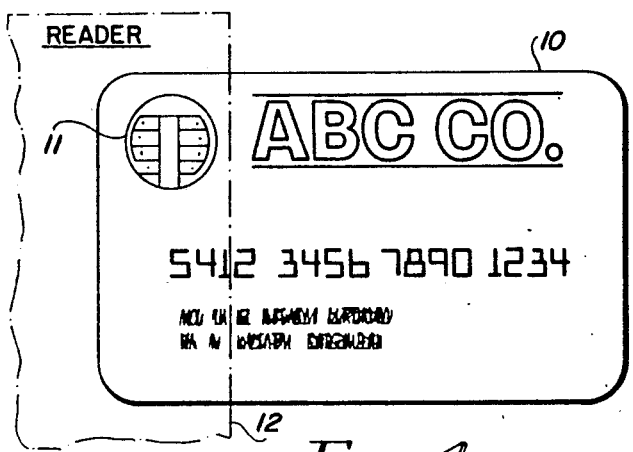
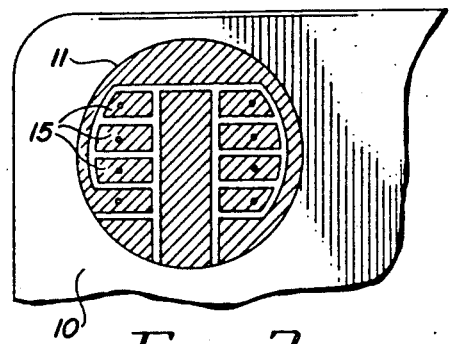
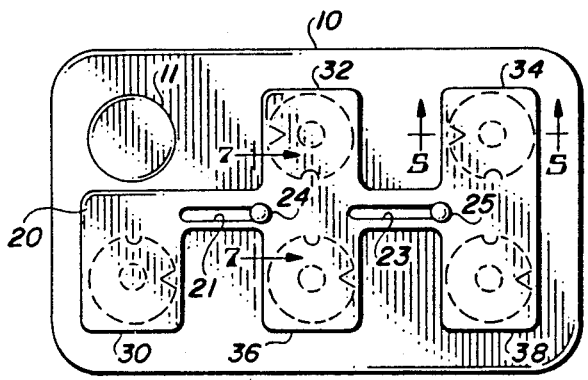
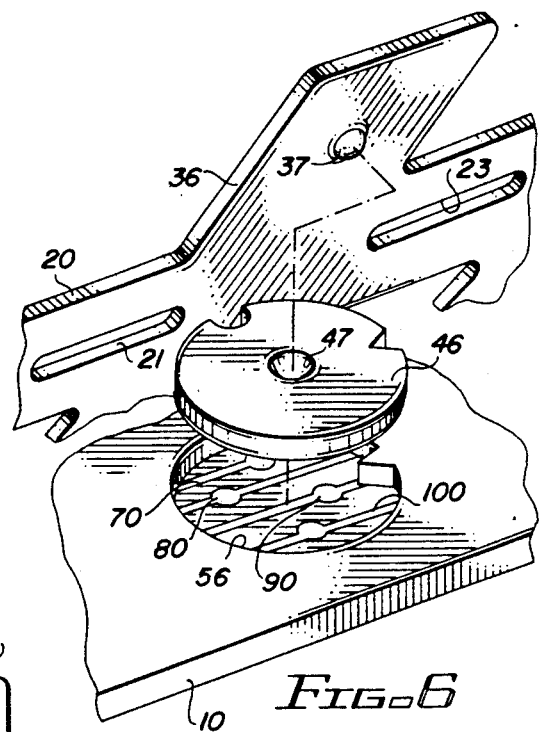
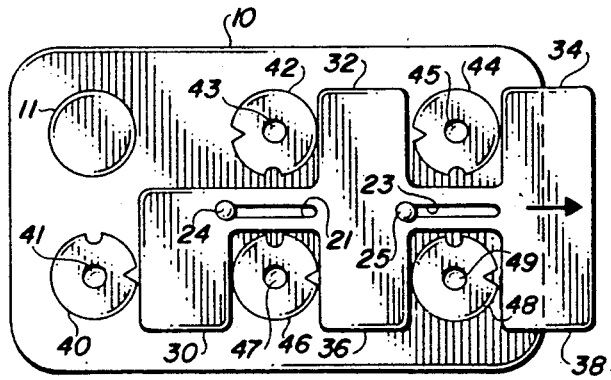
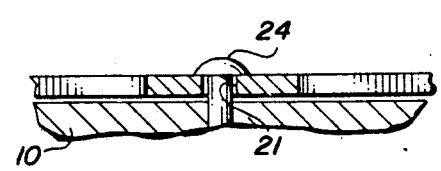
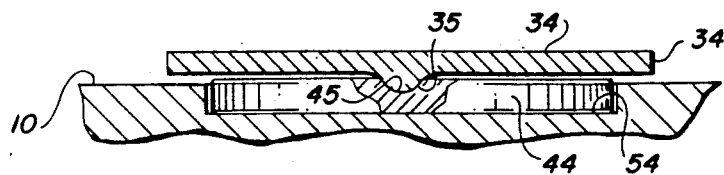

IC CARD SYSTEM WITH REMOVABLE IC MODULES

BACKGROUND

IC (integrated circuit) cards have been developed for a wide variety of different uses. Such IC cards typically include an IC with a memory element (ROM or RAM) and a control unit such as a microprocessor or microcomputer. The structure of the IC is such that the integrated circuit or IC is embedded in a portion of a plastic card having the dimensions and physical characteristics of standard credit cards in widespread use. The embedded IC includes a plurality of terminals on an exterior surface to permit the internal and external transfer of signals to and from the card. This is accomplished by inserting the card into a compatible reader which provides electrical contacts to connect the IC unit of the card to a card information processing unit associated with the reader. The reader also typically provides power for operating the card, and data is transferred to and from the card whenever it is inserted into the reader.

Since the memories in an IC card can be encoded to uniquely identify the card for a particular application, such cards may be utilized in a number of different application areas. When the sophisticated security features of such cards are employed, the cards may be used as an access key for computer systems, data bases and data networks, or for physical access control to hotel rooms, factories, offices or the like. IC cards increasingly are used for accessing automated bank terminals and permit translation information to be updated each time a transaction is made; so that the card uniquely tracks the authority of the user by information which is written into the memory of the IC circuit embedded in the card.

IC cards also may be utilized as small convenient, portable files, or records for any number of different types of information, such as personal telephone directories, detailed medical profiles, and the like. IC cards also are ideal for use as point-of-sale credit or debit operations, either in on-line or off-line systems, such as point-of-sale terminals in grocery stores, public telephones and the like.

Essentially, IC cards comprise tiny portable computers programmed to perform specific functions in accordance with the particular system with which such cards are designed for use. Standards have been developed and continue to evolve covering the overall size, electrical characteristics and other parameters for such cards. Typically, such cards are of the generally standard size of plastic credit cards, that is approximately 2 ¼" wide by 3 ⅜" long with a thickness of approximately .09". Slight variations in these dimensions exist, but currently available IC cards are close to this size. Variations currently are present in the manner in which data is read into or from the cards, so that cards developed by different manufacturers for use in different systems require readers which are configured to operate with the card of the particular manufacturer.

As such IC cards become more prevelant, the current development is such that consumers will carry numerous IC cards, each designed for use in a specific system or for a specific purpose, in the same manner as they now carry numerous magnetic striped credit cards.

In an effort to reduce the number of IC cards an individual may be required to carry, techniques have been developed to segment the IC card microprocessor and memory to permit the use of part of the data and/or programs by different services. This reduces the number of IC cards needed. A number of patents disclose systems directed to various techniques for providing this segmentation of the microprocessors and memories of the cards. For example, U.S. Pat. Nos. 4,709,137; 4,734568; 4,742,215; 4,751,732; 4,802,218; and 4,831,245, disclose such systems. All of these systems require, at the time of card issuance, either a pre-reserved use of program and/or memory or additional downloading of a microcode after the card issuance. No subsequent changes are possible, either by way of additions or deletions, once this has been done.

It also should be noted that IC cards periodically wear out like conventional credit cards and therefore must be replaced. Obviously, such IC cards are more expensive than ordinary credit cards because of the embedded microcomputers and memories which are provided in them. At such time a card becomes worn out, the services which were accessible with that card cannot be accessed until the card is replaced. For some transactions, such as bank machine transactions, this is a significant inconvenience, since the data stored in the IC card is of a dynamic nature and is not static.

It is desirable to provide an IC card system capable of reducing the number of IC cards in circulation, or required to be carried by an individual, providing simultaneous on-line utilization of several different IC units, and further providing a convenient way of replacing a worn out IC card while retaining the current data status of the various IC circuits or units used with the card.

SUMMARY OF THE INVENTION

It is an object of this invention to provide an improved IC card system.

It is another object of this invention to provide an improved IC card which reduces the number of IC cards required for multiple different types of transactions.

It is an additional object of this invention to provide an improved IC card system capable of use with different host computers or different programs selected by individual removable IC components in the card.

It is a further object of this invention to provide an IC card which enables the user to individually and easily insert and remove IC modules in the card to permit the card to be utilized simultaneously with several different applications via a single I/O device.

In accordance with the preferred embodiment of this invention, an IC card includes a card body of a predetermined thickness which has a network of bus conductors located within the card at a depth less than the predetermined thickness. An inlaid information processing unit is provided in the card and interconnects with the bus conductor. The inlaid processing unit also has external signal connection terminals on it for interconnection with an external device. Open receptacles are provided on the card extending from its surface to the network bus conductor to expose the network bus conductor in the bottom of the receptacles. Removable information IC processing units are configured to fit into the receptacles to make electrical contact with the network bus conductor, and these removable IC units are held in place in contact with the bus conductor by a slideable cover.

BRIEF DESCRIPTION OF THE DRAWING

FIG. 1 is an illustration of a standard prior art IC card;

FIG. 2 is an enlargement of a portion of the card shown in FIG. 1;

FIGS. 3 and 4 are top views of a preferred embodiment of the invention illustrating two different operating states of the preferred embodiment;

FIG. 5 is a cross-section taken along the line 5—5 of FIG. 3;

FIG. 6 is an exploded, perspective view of a portion of the embodiment shown in FIGS. 3, 4, and 5;

FIG. 7 is an enlarged cross-section taken along the line 7—7 of FIG. 3;

DETAILED DESCRIPTION

Figure 8:
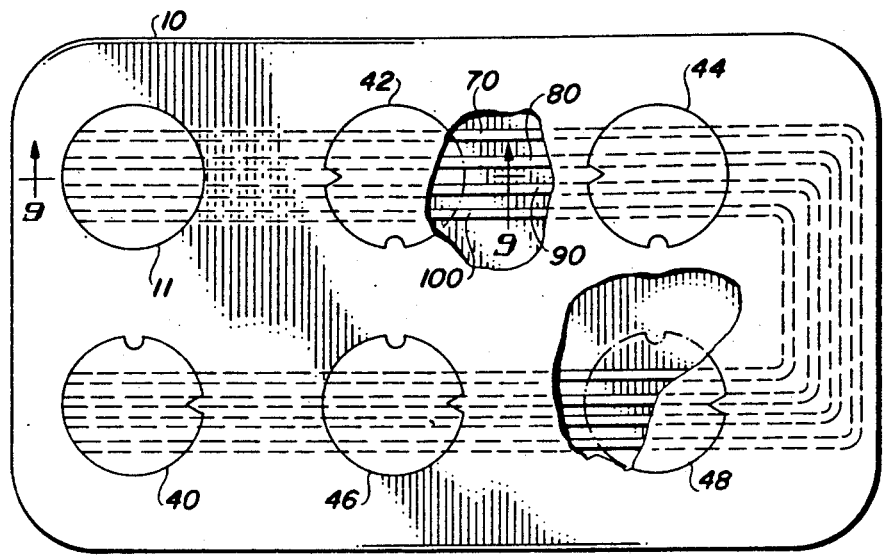
FIG. 8 is an enlarged diagrammatic, partially cut-away, top view of the embodiment of FIGS. 3 through 7.

Reference now should be made to the drawings in which the same reference numbers are used throughout the different figures to designate the same components. FIG. 1 is a top full-sized view of a conventional prior art IC card 10 which currently is in commercial use. The IC card 10 has an embedded microcomputer and memory circuit 11 located in the upper left-hand corner of the card, as shown in FIG. 1. This microcromputer circuit is generally of the size and dimensions of a United States penny. FIG. 2 is an enlargement of the exposed surface of the embedded IC circuit which shows a plurality of electrical contacts 15 located on this surface.

When the card 10 of FIG. 1 is used, it is inserted into a reader 12, illustrated by dotted lines in FIG. 1, which has probes or contacts configured to interconnect with the different contacts 15 on the surface of the embedded IC chip 11 placed on the card. The program of the microprocessor in the IC 11, in conjunction with the memories associated with it, permits the card to be used to conduct transactions in accordance with the program and/or information stored in the memories of the IC unit 11 in the card 10. As mentioned in the background portion of this specification, several different uses of such cards currently exist.

With a card of the type shown in FIGS. 1 and 2, it is necessary to use different cards 10 for effecting transactions with each different host system or host computer. For example, one card is required for use with banking machines, another card is used for effecting keyless door lock entry, while still another card is required for controlling fund transfers in conjunction with retail point of sale transactions. The result is that as such cards become increasingly popular, a consumer could end up carrying a small "stack" of such cards, much as is the current case today with standard credit cards.

The embodiment shown in FIGS. 3 through 11 is a significant modification and expansion of the limited use IC card, such as the card 10 of FIG. 1, to permit a single card 10 to be utilized to perform a number of different functions and/or to interface with different host computers for effecting different types of transactions.

Reference first should be made to FIGS. 8, 9, 10, and 11, which illustrate some of the basic modifications or changes to the card which have been made to permit this expanded use. The card is formed of at least two laminated plastic layers 10 and 59, (shown most clearly in FIG. 9) which have four parallel network bus conductors 70, 80, 90, and 100, sandwiched between them. The conductor extends in a pattern from beneath the embedded IC unit 11 underneath five additional receptacles (one of which, 56, is shown in detail in FIG. 6) located in two parallel lines and into which five removable IC module units 40, 42, 44, 46, and 48 are placed. As is readily apparent from an examination of FIGS. 3, 4, and 8, these modules are circular in configuration, with the same external diameter as the embedded IC unit 11. To ensure proper orientation of the modules 40, 42, 44, 46, and 48, over the network bus conductors 70, 80, 90, and 100, each module is asymmetrically notched. These notches with corresponding projections into the receptacles or openings through the layer 10 into which the modules are placed (as shown most clearly in FIG. 6).

Figure 9:
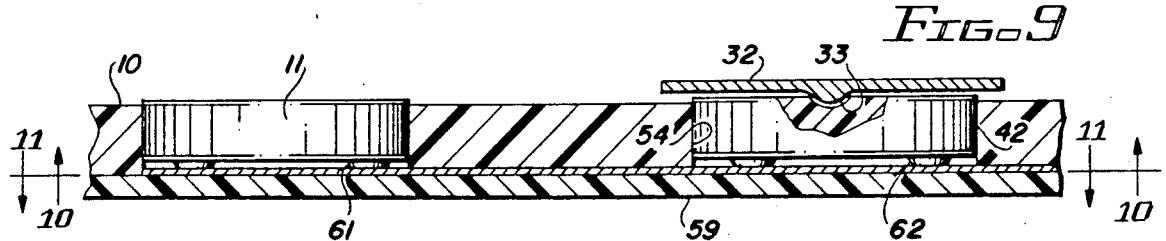
FIG. 9 is a partial cross-section taken along the line 9—9 of FIG. 8.
Figure 10:
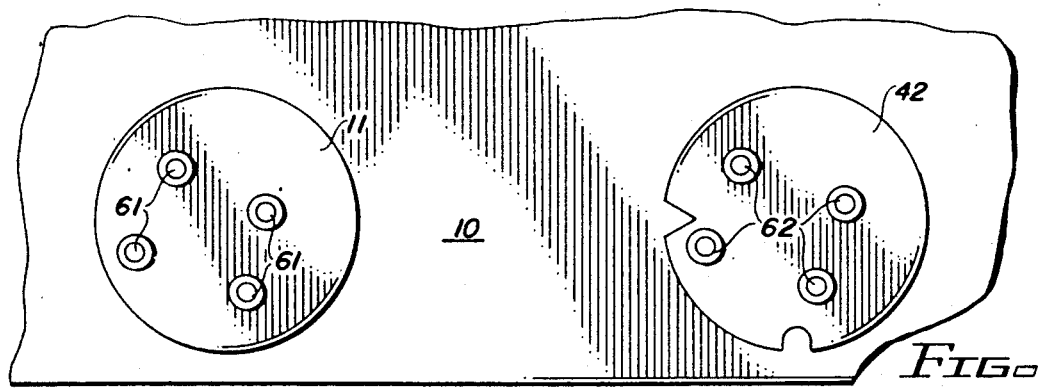
FIG. 10 is a view taken along the section line 10—10 of FIG. 9.
Figure 11:
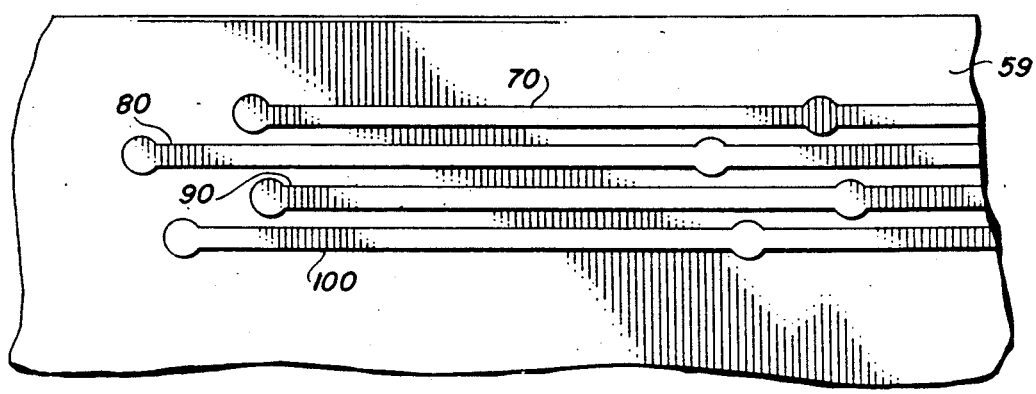
FIG. 11 is a view taken along the section line 11—11 of FIG. 9.

As illustrated in FIGS. 9, 10, and 11, the embedded IC unit 11 has a plurality of contacts 61 on the bottom; and these contacts are in electrical contact with the ends of the network bus conductors 70, 80, 90, and 100. Thus, an electrical interface is provided between the contacts 15 on the surface of the embedded IC unit 11 with the bus conductors 70, 80, 90, and 100 to permit signals applied to the surface contacts 15 of the IC unit 11 to pass either directly through the unit 11 to the bus conductors 70, 80, 90, and 100 or to permit utilization of the embedded IC unit 11 as a network controller and data server communicating information to the bus conductors.

Each of the removable IC module units (resembling penny-sized plastic tokens) include microprocessors, memories, and the necessary circuit interconnections embedded in non-conductive plastic with exposed contacts 62 on the bottom. When any one of the removable modules 40, 42, 44, 46, or 48 is placed in any one of the positions shown in FIG. 8, the contacts on the bottom of the module interconnect with the corresponding network bus conductors 70, 80, 90, and 100; so that electrical communication with these bus conductors and the conductors 61 on the bottom the IC unit 11 is effected. It should be noted in FIGS. 3, 4, and 8 that the notches in the removable IC modules or face toward the left in the upper row and toward the right in the lower row. This is done to provide the same orientation with respect to the bus conductors 70, 80, 90, and 100, since these conductors extend toward the right from the embedded IC unit 11 in the upper row and then downwardly and back toward the left in the bottom row. The projections in the receptacles in the layer 10 of the laminated card ensure the proper orientation and electrical connection of the removable module units irrespective of where they are placed on the card.

The removable module units 40, 42, 44, 46, and 48 are made to be easily inserted and replaced in accordance with the particular program information included in them for utilization with a desired host computer system. Consequently, they could fall out of the receptacles through the card 10 and be lost. Accordingly, a provision is made to hold them in place and still permit easy access to them whenever insertion of a module unit or removal of a module unit is desired. This is accomplished by the provision of a slide cover plate 20 made of electrically conducting material, preferably spring steel or the like. The plate 20 has a central portion with two aligned longitudinal slots 21 and 23 in it. These slots are placed over a pair of rivets 24 and 25 attached to the upper layer 10 of the laminated IC card. The heads of the rivets 24 and 25 extend over the edges of the slots 21 and 23, as illustrated most clearly in FIG. 7. Consequently, the plate 20 is movable from the position shown in FIG. 3 to the position shown in FIG. 4 and back again, with the lengths of the slots 21 and 23 and the positions of the rivets 24 and 25 determining the limits of movement which are illustrated in FIGS. 3 and 4.

The plate 20 has five outwardly extending cover flanges or plates 30, 32, 34, 36, and 38 which, in the closed position of FIG. 3, overlie the removable IC unit modules 40, 42, 44, 46, and 48, respectively. Each of these cover flanges 30, 32, 34, 36, and 38, has a corresponding downwardly projecting dimple, such as the dimples 35, 37, and 33, shown in FIGS. 5, 6, and 9, respectively. These dimples correspond with mating semispherical recesses 41, 43, 45, 47, and 49, located in the center of the removable IC module units 40, 42, 44, 46, and 48, respectively. The result is that when the cover plate 20 is moved to the position shown in FIG. 3, the dimples under each of the extending cover flanges, such as 34 and 36, shown in FIGS. 5 and 6, press into the mating recesses, such as 45 and 47, of the IC module located beneath them to press the corresponding module in place. This holds it in tight electrical engagement with the network bus conductors 70, 80, 90, and 100, and also prevents the removable IC module units from falling out of the recesses in the top layer 10 of the card.

When it is desired either to remove a removable IC module unit from the card or to place a new one into an open receptacle the cover plate 20 is moved to the position shown in FIG. 4. In this position, all of the module positions are exposed. It should be noted that when the cover plate 20 is moved between the two positions shown in FIGS. 3 and 4, the dimples, such as 35 and 37, ride up onto the surface of the removable modules and also onto the surface of the card 10 bending the corresponding cover flanges 30, 32, 34, 36, and 38 upwardly against the spring action of the material out of which the plate 20 is made. When the plate is in the position shown in FIG. 3, the nesting of the dimples, such as 35 and 37, into the corresponding recesses, such as 45 and 47, of the underlying removable IC module units acts as a detent to hold the plate 20 against accidental dislodgement.

FIG. 6 illustrates in detail the interrelationship between the cover plate 20 and the cover flanges, such as the cover flange 36 with respect to the removable IC module unit 46 and the receptacle 56. Receptacles such as the receptacles 54 and 56, shown in FIGS. 5 and 6, correspond with each of the removable IC module units 40, 42, 44, 46, and 48, in the positions shown in FIGS. 3 and 4. One or more of these module units may be used at any time, depending upon the number of different programs and the number of different host computers with which the system is designed to interact.

From the foregoing, it can be seen that a single IC card, such as the card shown in FIGS. 3 through 11, is capable of replacing six individual separate IC cards of the type commonly in use today. Furthermore, it is possible to change the various programs or host computer systems with which the card is used, at any time simply by placing a new removable IC module unit or token into one of the corresponding receptacles, or by replacing one of the IC module units 40, 42, 44, 46, and 48 with a different one.

To further expand the multiple on line capability of the system, a magazine for holding several cards 10 may be used. Such a magazine can be used to place multiple cards, each with several modules on it, in position for use with a single card reader. The cards may be interconnected with buses in the magazine, or they each may simply be available for individual presentation to a card reader 12.

The foregoing description of the preferred embodiment of the invention should be considered as illustrative of the invention and not as limiting. Various changes and modifications will occur to those skilled in the art without departing from the true scope of the invention as defined in the appended claims. For example, the illustration used shows four bus conductors 70, 80, 90, and 100, as the network bus conductors. This number of conductors clearly can be varied in accordance with the operating conditions of the system. For example, a single conductor may be used for multiplex operations, and for parallel operations the number of conductors may be increased or decreased in accordance with the system requirements. In addition, the technique for ensuring proper orientation of the removable IC unit modules may be changed from the mating notches and projection structures which are illustrated in the drawings. The configuration of the cover plate 20 also may be varied, as well as the manner in which the cover plate is attached to the layer 10 of the laminated IC card to permit the sliding movement which is shown. All such changes and others which will occur to those skilled in the art are considered to be clearly within the scope of this invention.

I claim:

1. An IC card including in combination:
 a card body of a predetermined thickness having a first surface and having a network bus conductor therein at a distance from said first surface which is less than said predetermined thickness;
 an inlaid information processing unit in said card body having external signal connection terminals on an exposed face thereof at said first surface of said card body and electrically interconnected with said network bus conductor;
 at least one open receptacle extending from the first surface of said card body to a depth to expose said network bus conductor therein for electrical contact with conductive terminals of a removable information processing unit configured to fit into said receptacle and
 retaining means comprising cover means extending over said receptacle in a first position thereof and movable to a second position to expose said receptacle for releasably retaining removable information processing units in said receptacle.

2. The combination according to claim 1 further including means associated with said receptacle for ensuring a predetermined orientation of removable information processing units placed into said receptacle.

3. The combination according to claim 2 wherein said inlaid information processing unit includes a signal processing integrated circuit.

4. The combination according to claim 3 wherein said orienting means comprises mating projections and notches on the corresponding edges of said receptacle and such removable information processing units.

5. The combination according to claim 4 wherein said inlaid information processing unit comprises an inlaid microprocessor, and the removable information processing units comprise integrated circuit microprocessor systems embedded in nonconductive material with exposed terminals thereon for making electrical contact with said network bus conductor.

6. The combination according to claim 5 wherein said card body comprises a laminate of at least two layers, a first layer thereof having said network bus conductor thereon and the second layer thereof having said inlaid information processing unit therein and having said receptacle in the form of a hole therethrough, said second layer being bonded to said first layer to align the hole therethrough over said network bus conductor on said second layer to expose said network bus conductor in the hole through said second layer.

7. The combination according to claim 6 wherein said network bus conductor includes a plurality of bus conductors extending in parallel with one another and in parallel with the first surface of said card body.

8. The combination according to claim 7 wherein said retaining means comprises a conductive plate movably attached to the first surface of said card body for movement in a plane parallel to such first surface between a first position overlying said open receptacle to a second position exposing said receptacle.

9. The combination according to claim 8 further including a plurality of open receptacles, each extending from the first surface of said card body to a depth to expose said network bus conductor therein in each of said receptacles.

10. The combination according to claim 7 wherein said retaining means is made of electrically conductive material.

11. The combination according to claim 1 wherein said retaining means comprises a conductive plate movably attached to the first surface of said card body for movement in a plane parallel to such first surface between a first position overlying said open receptacle to a second position exposing said receptacle.

12. The combination according to claim 1 wherein said retaining means is made of electrically conductive material.

13. The combination according to claim 1 wherein said card body comprises a laminate of at least two layers, a first layer thereof having said network bus conductor thereon and the second layer thereof having said inlaid information processing unit therein and having said receptacle in the form of a hole therethrough, said second layer being bonded to said first layer to align the hole therethrough over said network bus conductor on said second layer to expose said network bus conductor in the hole through said second layer.

14. The combination according to claim 1 wherein said network bus conductor includes a plurality of bus conductors extending in parallel with one another and in parallel with the first surface of said card body.

15. An IC card including in combination:
a card body of a predetermined thickness having a first surface and having a network bus conductor therein at a distance from said first surface which is less than said predetermined thickness;
an inlaid information processing unit in said card body having external signal connection terminals on an exposed face thereof at said first surface of said card body and electrically interconnected with said network bus conductor;
a plurality of open receptacles extending from the first surface of said card body to a depth to expose said network bus conductor in each of said receptacles for electrical contact with conductive terminals of different removable information processing units configured to fit into each of said receptacles.

16. The combination according to claim 15 further including means associated with each of said receptacles for ensuring a pre-determined orientation of removable information processing units placed into each said receptacle.

17. The combination according to claim 16 wherein said orienting means comprises mating projections and notches on the corresponding edges of each of said receptacles and such removable information processing units.

18. The combination according to claim 15 wherein said inlaid information processing unit comprises an inlaid microprocessor, and the removable information processing units comprise integrated circuit microprocessor systems embedded in nonconductive material with exposed terminals thereon for making electrical contact with said network bus conductor.

19. The combination according to claim 1 wherein said inlaid information processing unit includes a signal processing integrated circuit.

* * * * *